(12) United States Patent
Ring et al.

(10) Patent No.: US 7,525,122 B2
(45) Date of Patent: Apr. 28, 2009

(54) PASSIVATION OF WIDE BAND-GAP BASED SEMICONDUCTOR DEVICES WITH HYDROGEN-FREE SPUTTERED NITRIDES

(75) Inventors: Zoltan Ring, Durham, NC (US); Helmut Hagleitner, Zebulon, NC (US); Jason Patrick Henning, Carrboro, NC (US); Andrew Mackenzie, Cary, NC (US); Scott Allen, Apex, NC (US); Scott Thomas Sheppard, Chapel Hill, NC (US); Richard Peter Smith, Carrboro, NC (US); Saptharishi Sriram, Cary, NC (US); Allan Ward, III, Durham, NC (US)

(73) Assignee: Cree, Inc., Durham, NC (US)

( * ) Notice: Subject to any disclaimer, the term of this patent is extended or adjusted under 35 U.S.C. 154(b) by 334 days.

(21) Appl. No.: 11/169,378

(22) Filed: Jun. 29, 2005

(65) Prior Publication Data

US 2007/0001174 A1    Jan. 4, 2007

(51) Int. Cl.
*H01L 29/15* (2006.01)
*H01L 31/0256* (2006.01)

(52) U.S. Cl. .................... 257/76; 257/99; 257/E29.104

(58) Field of Classification Search ................ 438/791; 257/76, 99, E29.104
See application file for complete search history.

(56) References Cited

U.S. PATENT DOCUMENTS

| | | |
|---|---|---|
| 3,982,267 A | 9/1976 | Henry |
| 5,332,697 A | 7/1994 | Smith et al. |
| 5,430,324 A | 7/1995 | Bencuya |
| 5,605,852 A | 2/1997 | Bencuya |
| 5,972,801 A | 10/1999 | Lipkin et al. |
| 6,246,076 B1 | 6/2001 | Lipkin et al. |

(Continued)

FOREIGN PATENT DOCUMENTS

EP    1 149 934 A2    10/2001

(Continued)

OTHER PUBLICATIONS

Lipkin et al., Improved Oxidation Procedures for Reduced SiO2/SiC Defects; Journal of Electronic Materials; vol. 25, No. 5, 1996, pp. 909-915.

(Continued)

*Primary Examiner*—Marcos D. Pizarro
*Assistant Examiner*—Igwe U. Anya
(74) *Attorney, Agent, or Firm*—Summa, Additon & Ashe, P.A.

(57) ABSTRACT

A passivated semiconductor structure and associated method are disclosed. The structure includes a silicon carbide substrate or layer; an oxidation layer on the silicon carbide substrate for lowering the interface density between the silicon carbide substrate and the thermal oxidation layer; a first sputtered non-stoichiometric silicon nitride layer on the thermal oxidation layer for reducing parasitic capacitance and minimizing device trapping; a second sputtered non-stoichiometric silicon nitride layer on the first layer for positioning subsequent passivation layers further from the substrate without encapsulating the structure; a sputtered stoichiometric silicon nitride layer on the second sputtered layer for encapsulating the structure and for enhancing the hydrogen barrier properties of the passivation layers; and a chemical vapor deposited environmental barrier layer of stoichiometric silicon nitride for step coverage and crack prevention on the encapsulant layer.

39 Claims, 3 Drawing Sheets

U.S. PATENT DOCUMENTS

| | | | |
|---|---|---|---|
| 6,396,090 | B1 | 5/2002 | Hsu et al. |
| 6,426,542 | B1 | 7/2002 | Tan |
| 6,429,518 | B1 * | 8/2002 | Endo ......................... 257/753 |
| 6,437,371 | B2 | 8/2002 | Lipkin et al. |
| 6,528,373 | B2 | 3/2003 | Lipkin et al. |
| 6,586,781 | B2 | 7/2003 | Wu et al. |
| 6,610,366 | B2 | 8/2003 | Lipkin |
| 6,673,662 | B2 | 1/2004 | Singh |
| 6,767,843 | B2 | 7/2004 | Lipkin et al. |
| 6,797,586 | B2 | 9/2004 | Dev |
| 6,825,501 | B2 | 11/2004 | Edmond et al. |
| 2001/0028100 | A1 * | 10/2001 | Schmitz et al. ............. 257/649 |
| 2003/0025121 | A1 | 2/2003 | Edmond et al. |
| 2003/0160274 | A1 | 8/2003 | Das |
| 2003/0201453 | A2 * | 10/2003 | Edmond ...................... 257/99 |
| 2004/0099888 | A1 | 5/2004 | Sriram |
| 2004/0099928 | A1 | 5/2004 | Nunan et al. |
| 2004/0159865 | A1 | 8/2004 | Allen et al. |
| 2005/0170574 | A1 * | 8/2005 | Sheppard et al. ............ 438/172 |
| 2005/0258431 | A1 * | 11/2005 | Smith et al. ................... 257/79 |
| 2006/0006415 | A1 | 1/2006 | Wu et al. |
| 2006/0145190 | A1 * | 7/2006 | Salzman et al. ............. 257/192 |
| 2006/0157733 | A1 * | 7/2006 | Lucovsky et al. ........... 257/192 |
| 2007/0001174 | A1 | 1/2007 | Ring et al. |

FOREIGN PATENT DOCUMENTS

WO    WO 2005/076365      8/2005

OTHER PUBLICATIONS

G.Y. Chung et al., Effect of Nitric Oxide Annealing on the Interface Trap Densities Near the Band Edges in the 4H Polytype of Silicon Carbide; Applied Physics Letters, vol. 76, No. 13, Mar. 2000, pp. 1713-1715.

H.F. Li et al., Improving SiO2 Grown on P-Type 4H-SiC by NO Annealing; Materials Science Forum; vols. 264-268, 1998, pp. 869-872, 1998 Trans Tech Publications, Switzerland.

Lipkin et al., N2O Processing Improves the 4H-SiC:SiO2 Interface: Materials Science Forum; vols. 389-393, 2002, pp. 985-988, 2002 Trans Tech Publications, Switzerland.

Ohno Y et al: "Effect of surface passivation on breakdown of AlGaN/Gan HEMTs," Compound Semiconductors, 2003, International Symposium Aug. 25-27, 2003, Piscataway, NJ, pp. 169-170.

Ganem J-J et al: "NRA and XPS Characterizations of Layers Formed by Rapid Thermal Nitridation of Thin SI02 Films," Nuclear Instruments & Methods in Physics Research, Section-B: Beam Interactions With materials and Atoms, Elsevier, Amsterdam, NL vol. 1364, No. 1-4, 1992, pp. 744-749.

International Search Report and Written Opinion for International Application No. PCT/US2006/048817, mailed Jun. 25, 2007.

* cited by examiner

PASSIVATION OF WIDE BAND-GAP BASED SEMICONDUCTOR DEVICES WITH HYDROGEN-FREE SPUTTERED NITRIDES

BACKGROUND

The present invention relates to semiconductor structures and devices formed in wide bandgap materials such as silicon carbide and the Group III nitrides.

The performance capabilities of semiconductor devices fundamentally depend upon the inherent properties of the semiconductor materials from which they are made, as well as the extent to which these materials can be incorporated in a useful device structure. Semiconductor devices also depend upon the manner in which various semiconductor materials are formed and arranged with respect to one another.

One of the characteristics of semiconductor materials is their bandgap; i.e., the energy difference between the valence band of electrons and the conductance band. The size of the material's bandgap provides fundamental limitations upon— or possibilities for—device structures and performances.

As one example, microwave systems—typical examples of which include cellular communications systems—commonly use solid state transistors as amplifiers and oscillators. As such systems expand in subscribers and desired (or required) capacity, interest in increasing their operating frequency and power has grown correspondingly. Higher frequency signals can carry more information (bandwidth), allow for smaller antennas with very high gain, and provide systems such as radar with improved resolution. Because a larger bandgap can accommodate wider bandwidth signals, wide bandgap materials such as silicon carbide (SiC) and the Group III (Ga, Al, In) nitrides have been, and continued to be, materials of significant interest for high frequency devices.

Higher bandgap materials also offer the potential for higher power capabilities (as compared to similar structures made from smaller bandgap materials) as well as the potential for emitting light at higher frequencies; e.g., the green, blue, violet and ultraviolet portions of the electromagnetic spectrum.

Devices fabricated from silicon carbide are typically passivated with an oxide layer, such as $SiO_2$, to protect the exposed SiC surfaces of the device, or for other reasons, or both. The interface between SiC and $SiO_2$, however, may be insufficient to obtain a high surface mobility of electrons. More specifically, the interface between SiC and $SiO_2$ conventionally exhibits a high density of interface states, which may reduce surface electron mobility and introduce carrier traps, which in turn reduces the desired performance characteristics of devices such as (but not limited to) metal-oxide-semiconductor field-effect transistors (MOSFETs).

Accordingly, in many circumstances semiconductor devices, including those that include oxidation layers, also incorporate one or more layers of silicon nitride to improve the resulting electronic properties (e.g., U.S. Pat. No. 6,246,076). Silicon nitride also provides an environmental barrier that the oxide fails to provide, or without which, would allow the environment to degrade the structure and operation of the device, regardless of whether the device includes an oxide layer. As an environmental barrier, silicon nitride is preferred over silicon dioxide because it forms a better seal over the device, preventing contaminants such as water from reaching the epitaxial layers of the device and from causing degradation. Silicon nitride may also be used to form layers that transmit light generated within an LED.

The dense structure of silicon nitride does not provide the open channels found in oxide structures; thus, nitride is widely employed in electronics as a barrier material. In particular, hydrogen diffuses slowly in a densified nitride film, and other small positive ions ($Na^+$ or $K^+$) are effectively blocked by thin nitride layers. Because oxygen diffuses very slowly through nitride, deposited nitride can prevent oxidation of underlying silicon.

Nevertheless, nitrides deposited using chemical vapor deposition (often plasma enhanced chemical vapor deposition, "PECVD") almost always contain hydrogen, typically much more than in the comparable oxide films. The source of the hydrogen is the silane precursor and also the ammonia employed in many CVD schemes. An amorphous, but constrained, film such as silicon nitride can discourage the atoms from occupying positions that fill the valences of each silicon and nitrogen atom. Thus, many broken bonds tend to be present. These bonds are readily occupied by hydrogen atoms. Thus, conventional plasma nitrides can have as much as 20 atomic percent hydrogen, bonded both to the Si and N atoms; thermal nitrides still have several percent hydrogen even after high-temperature anneals.

Additionally, hydrogen can passivate Mg-acceptors in a GaN-based semiconductor. Although the precise mechanism is not completely understood, when silicon nitride is deposited by means of PECVD at a deposition temperature in excess of 200° C., hydrogen in the film can diffuse through thin ohmic contacts or other layers and into nearby Group III nitride layers, causing them to become passivated in a region close to their surface. That is, in a region near the surface, a substantial number of acceptor ions are rendered neutral by the introduction of hydrogen in the film. Accordingly, an interface between an ohmic contact and a nitride material is degraded, and the contact metal does not exhibit ideal ohmic characteristics. This can result in an increase in forward voltage ($V_f$ degradation) in the device. Essentially, the device will behave as though the interface between a metal and a Group III nitride contact layer forms a Schottky contact instead of an ohmic contact.

Because nitride passivation layers are often used in conjunction with oxide layers, the hydrogen can migrate to the oxide layers. In turn, hydrogen in oxide films on SiC has been shown to alter the interface Fermi level and encourage a state of surface accumulation. Any resulting accumulation layer produces a charge layer that alters the device capacitance and exhibits a drift with a long time constant caused by the mobility of the hydrogen in the film.

Accordingly, although oxide and nitride layers offer certain advantages, they also raise certain problems that can limit or degrade device performance.

SUMMARY

In one aspect, the invention is a passivated semiconductor structure comprising a silicon carbide substrate or layer; an oxidation layer on the silicon carbide substrate for lowering the interface density between the silicon carbide substrate and the thermal oxidation layer; a first sputtered non-stoichiometric silicon nitride layer on the thermal oxidation layer for reducing parasitic capacitance and minimizing device trapping; a second sputtered non-stoichiometric silicon nitride layer on the first layer for positioning subsequent passivation layers further from the substrate (and devices thereon) without encapsulating the structure; a sputtered stoichiometric silicon nitride layer on the second sputtered layer for encapsulating the structure and for enhancing the hydrogen barrier properties of the passivation layers; and a chemical vapor deposited environmental barrier layer of stoichiometric silicon nitride for step coverage and crack prevention on the encapsulant layer.

In another aspect, the invention is a passivated semiconductor structure comprising a Group III nitride layer (including substrates); a first passivation structure on the Group III nitride layer for reducing parasitic capacitance and minimizing device trapping; and a second passivation structure on the first passivation structure for encapsulating the structure and providing an environmental barrier; the first passivation structure comprising at least one sputtered layer of non-stoichiometric nitride selected from the group consisting of silicon nitride, aluminum nitride, oxynitrides of silicon and oxynitrides of aluminum, and at least one chemical vapor deposited layer of silicon nitride for positioning the passivation layers further from the Group III nitride layer without fully encapsulating the structure; and the second passivation structure comprising an environmental barrier of stoichiometric nitrides.

In another aspect, the invention is an insulated semiconductor device comprising a silicon carbide substrate having a first conductivity type; respective source and drain regions in the substrate having the opposite conductivity type and defining a channel therebetween; a thermal oxide layer on the substrate between the source and drain for lowering the interface density between the silicon carbide substrate and the thermal oxidation layer; a gate contact on the thermal oxide layer; a first passivation structure formed of non-stoichiometric silicon nitride on the thermal oxide layer for reducing parasitic capacitance and minimizing device trapping and positioning subsequent passivation layers further from the substrate; and a second passivation structure formed of stoichiometric silicon nitride on the first passivation structure for providing an environmental barrier for the device.

In another aspect, the invention is a passivated semiconductor structure comprising a silicon carbide substrate; a thermal oxidation layer on the silicon carbide substrate for lowering the interface density between the silicon carbide substrate and the thermal oxidation layer; a first substantially hydrogen-free non-stoichiometric silicon nitride layer on the thermal oxidation layer for reducing parasitic capacitance and minimizing device trapping; a second substantially hydrogen-free non-stoichiometric silicon nitride layer on the first layer for positioning subsequent passivation layers further from the substrate (and devices thereon) without encapsulating the structure; a substantially hydrogen-free stoichiometric silicon nitride layer on the second substantially hydrogen-free layer for encapsulating the structure and for enhancing the hydrogen barrier properties of the passivation layers; and an environmental barrier layer of stoichiometric silicon nitride for step coverage and crack prevention on the encapsulant layer.

In yet another aspect, the invention is a method of passivating wide bandgap devices, the method comprising sputter-depositing a non-stoichiometric silicon nitride layer on an oxide layer; and depositing an environmental barrier layer of stoichiometric silicon nitride by chemical vapor deposition.

In yet another aspect, the invention is a method of passivating wide bandgap devices, the method comprising sputter-depositing a non-stoichiometric nitride layer selected from the group consisting of silicon nitride and aluminum nitride on a layer of Group III nitride semiconductor material; and depositing an environmental barrier layer of stoichiometric silicon nitride by chemical vapor deposition on to the sputter-deposited layer The foregoing and other objects and advantages of the invention and the manner in which the same are accomplished will become clearer based on the followed detailed description taken in conjunction with the accompanying drawings.

DETAILED DESCRIPTION

The invention is a passivated semiconductor structure and resulting passivated semiconductor devices. In one aspect, the invention can be broadly considered as a two part structure in which a chemical vapor deposited passivation layer of silicon nitride encapsulates a previously sputtered-deposited layer of silicon nitride. The sputtered layer provides some of the benefits of passivation and the chemical vapor deposited layer provides an excellent environmental barrier.

In another aspect, the invention is a two-part structure formed of a stoichiometric layer of silicon nitride deposited upon a non-stoichiometric layer of silicon nitride. The non-stoichiometric layer enhances the electronic properties of the structure or resulting device and the stoichiometric layer provides an excellent environmental barrier.

Figure 1:
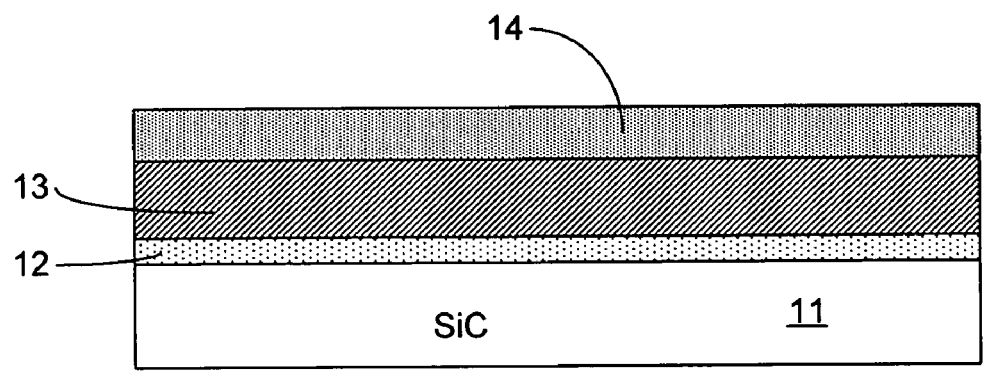
FIG. 1 is a cross-sectional schematic view of a semiconductor structure according to the present invention.

FIG. 1 shows a semiconductor structure broadly designated at 10 in cross sectional schematic fashion. In this embodiment, the structure includes a silicon carbide substrate (or layer) 11 with an oxidation layer 12, typically a thermally-generated layer of silicon dioxide, on the silicon carbide substrate 11. It will be understood that the term "substrate" is descriptive and explanatory of the silicon carbide portion 11 rather than limiting. Thus, the silicon carbide substrate 11 can be a wafer or wafer precursor, or can be a functional layer positioned upon other supporting structures (not shown).

The thermal oxidation layer 12 lowers the interface density between the silicon carbide substrate 11 and the thermal oxidation layer 12 and thus enhances the operation of the resulting devices formed from or incorporating the structure 10.

The embodiment illustrated in FIG. 1 shows a sputtered silicon nitride portion 13 and a plasma enhanced chemical vapor deposited (PECVD) layer of silicon nitride 14. Although the invention can be broadly described in this manner, additional advantages are schematically illustrated in FIG. 2.

Figure 2:
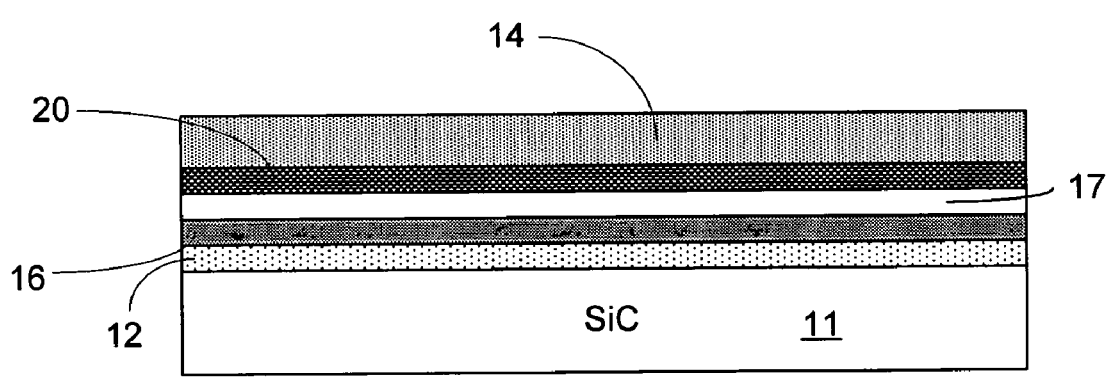
FIG. 2 is another schematic view of a structure according to the present invention.

FIG. 2 shows the structure broadly designated at 15. The structure 15 again includes the silicon carbide substrate 11 and the thermal oxide 12.

It will be understood that as used herein and as is common in the semiconductor art, past tense terms such as, "oxidized," "sputtered," and "chemical vapor deposited," are used as adjectives as well as verbs. Thus, they describe structures which are well understood in this art and the context of their use will be clear herein.

In FIG. 2, a first sputtered nonstoichiometric layer 16 is on the thermal oxidation layer 12 for reducing parasitic capacitance and minimizing device trapping. A second sputtered non-stoichiometric silicon nitride layer 17 is on the first layer 16 for positioning subsequent passivation layers further from the substrate 11, but without fully encapsulating the structure 15. A sputtered stoichiometric silicon nitride layer 20 is on the second sputtered nonstoichiometric layer 17 for initially encapsulating the structure 15 and for enhancing the hydrogen barrier properties of the passivation layers. The chemical vapor deposited environmental barrier layer, again labeled at 14, covers the device to provide step coverage and crack prevention.

In somewhat greater detail, the thermal oxidation layer 12 is stoichiometric silicon dioxide ($SiO_2$) with a thickness in exemplary embodiments of between about 100 and 500 angstroms (Å). This is a sufficient thickness to provide the electronic benefits of the oxide (as opposed to a nitride-only passivation), but less than a thickness that would raise additional manufacturing problems.

As set forth elsewhere herein, the nature of sputtering is such that it provides a silicon nitride layer that is substantially hydrogen-free. Thus layers 16, 17 and 20 are advantageously substantially hydrogen free.

The first two sputtered layers 16 and 17 are preferentially nitrogen-rich. As well understood in this art, the proportion of silicon or nitrogen (in a non-stoichiometric composition) can be determined by the refractive index, which is an indicator of the composition of the formed silicon nitride film. A silicon nitride film having a substantially stoichiometric composition has a refractive index of 2.02 measured @6328 Å.

Silicon rich nitride has an atomic ratio of silicon to nitrogen that is greater than 3:4 (i.e., stoichiometric silicon nitride is $Si_3N_4$). A typical silicon rich nitride will have an index of refraction of greater than 2.02 measured @6328 Å and a nitrogen rich SiN film will have an index of refraction lower than 2.02 measured @6328 Å.

Accordingly, in exemplary embodiments each of the non-stoichiometric sputtered silicon nitride layers 16 and 17 have a refractive index of between about 1.85 and 1.95.

The silicon carbide substrate is often a single crystal and has a polytype selected from the group consisting of the 3C, 4H, 6H and 15R polytypes of silicon carbide.

One purpose of sputtering is to avoid the presence of hydrogen as described elsewhere herein, and to correspondingly avoid the electronic problems associated with the presence of hydrogen. Accordingly, the sputtered layers described with respect to FIGS. 1 and 2 can also be understood as hydrogen-free layers. Stated differently, sputtering is one technique for producing a hydrogen-free passivation layer. The invention, however, can also be understood as the hydrogen free passivation layer regardless of its method of manufacture.

Figure 3:
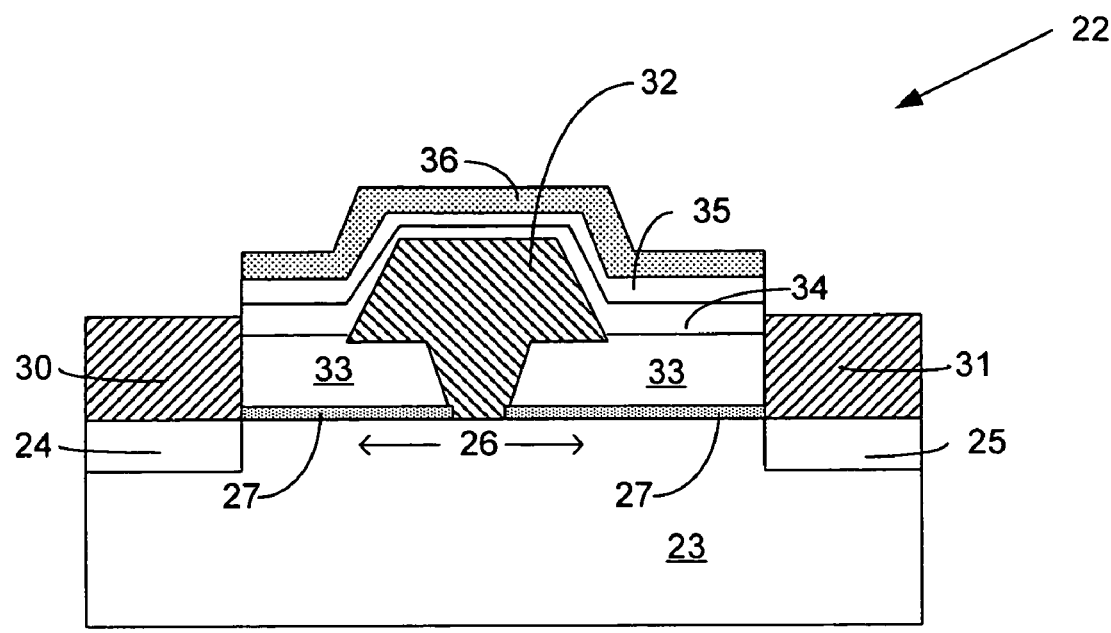
FIG. 3 is a schematic cross-sectional view of a silicon carbide based device that incorporates the present invention.
Figure 4:
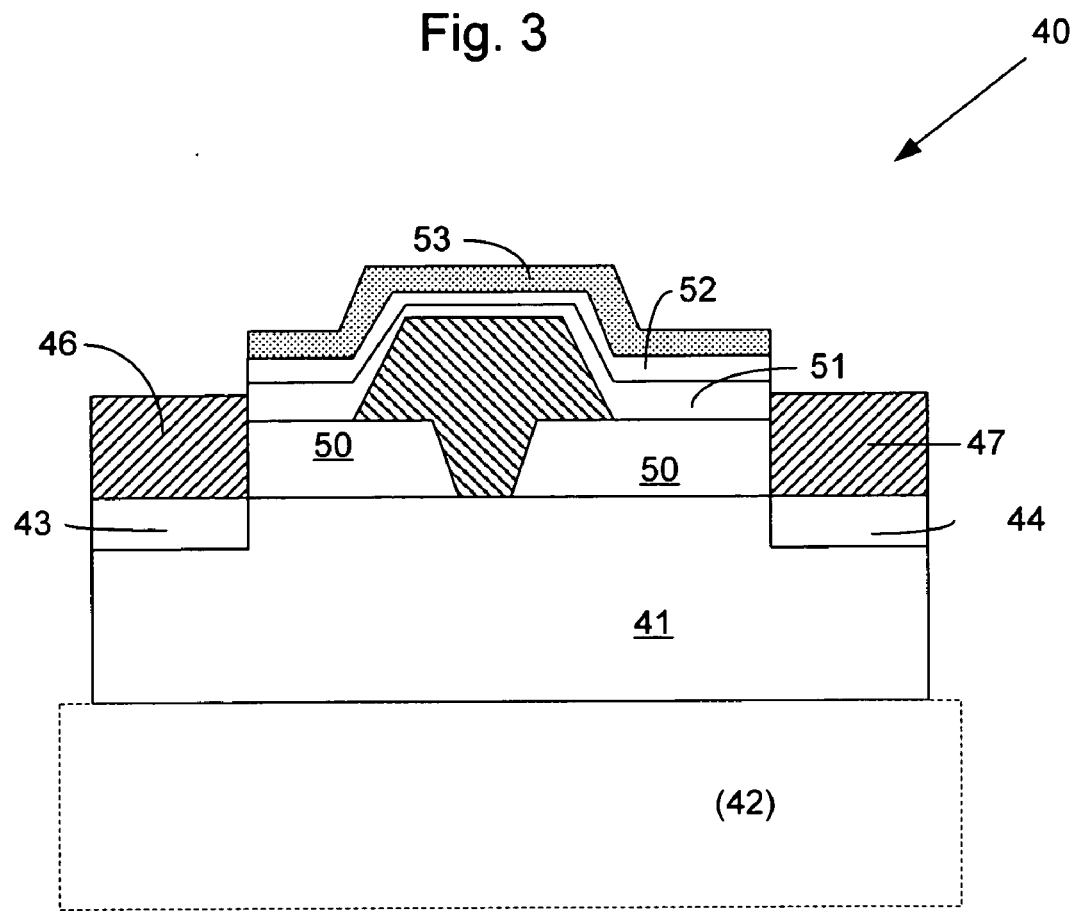
FIG. 4 is a schematic cross sectional view of a Group III nitride based device that incorporates the present invention.

FIGS. 3 and 4 illustrate the invention in the context of respective exemplary devices. It will be understood that the invention is not limited to the illustrated devices or to particular families of devices, but can be incorporated as desired or needed in a wide variety of devices familiar to those of skill in this art.

FIG. 3 illustrates a silicon carbide based device broadly designated at 22. The device includes an SI silicon carbide substrate 23 that has a first conductivity type (i.e., n or p). Respective source 24 and drain regions 25 are formed either in or adjacent the substrate 23, and define a channel region 26 therebetween. The device 22 includes a thermal oxide layer 27 as described previously and respective ohmic contacts to the source 30, the drain 31 and as a gate contact 32. Because the nature of the invention in is primarily, although not exclusively, emphasized in the passivation structure, the operation of the device 22, which is otherwise well understood by those of ordinary skill in this art, will not be described in detail herein. Exemplary references for semiconductor devices include Dorf, *The Electrical Engineering Handbook*, Second Edition (CRC Press 1997), Chapter 39, particularly pages 994-996; and *Sze, Physics of semiconductor Devices*, Second Edition (John Wiley & Sons, Inc. 1981).

It will likewise be understood that the materials for the ohmic and gate contacts can be selected from a plurality of metals or highly conductive semiconductors and that this can be accomplished without undue experimentation by those of skill in this art.

A first passivation structure formed of nonstoichiometric silicon nitride is on the thermal oxide 27. The first passivation structure reduces parasitic capacitance and minimizes device trapping and positions subsequent passivation layers further from the channel 26. In the illustrated embodiment, the first passivation structure comprises two layers 33 and 34 of sputtered non-stoichiometric silicon nitride on the thermal oxide layer 27.

In the illustrated embodiment the second passivation structure comprises a sputtered-deposited layer 35 of silicon nitride on the first passivation structure, and in particular on the layer 34, and a chemical vapor deposited layer 36 of silicon nitride on the sputter-deposited layer 35. In exemplary embodiments, both of the layers 35 and 36 comprise stoichiometric silicon nitride.

As noted elsewhere, the sputtered layers 33 and 34 are advantageously substantially hydrogen free, and similarly because the layer 35 is also sputtered, it is likewise substantially hydrogen free.

FIG. 4 illustrates a device 40 based on gallium nitride (GaN) or aluminum gallium nitride (AlGaN) as the semiconductor. The device 40 includes the gallium nitride or aluminum gallium nitride layer 41 and potentially can include an additional substrate or substrate and buffer structure which is designated by the dotted rectangle 42. A bulk crystal of gallium nitride can theoretically eliminate the need for the substrate and buffer 42, but most devices of this type will include a substrate of SiC or sapphire or some other suitable material.

It will be further understood that the aluminum gallium nitride is best expressed as $Al_xGa_{1-x}N$ where 0<x<1. The atomic fractions of aluminum and gallium can be selected as desired or necessary based upon the intended structure and operation of the device The device 40 includes the source region 43 and the drain region 44. In the embodiment illustrated in FIG. 4, the oxide layer is not present and, as known to those familiar with these materials and structures, neither gallium nitride nor aluminum gallium nitride form a suitable oxide under typical conditions appropriate for semiconductor device manufacture. Similarly, ohmic contacts 46 and 47 are made to the source 43 and drain 44 respectively.

The device 40 includes the first sputtered silicon nitride or aluminum nitride layer 50 and the second sputtered silicon nitride layer 51, both of which may be non-stoichiometric, hydrogen-free, and have a refractive index of between about 1.85 and 2.05. The encapsulating stoichiometric silicon nitride layer is illustrated at 52 in FIG. 4 and the plasma enhanced chemically vapor deposited layer is illustrated at 53 and is stoichiometric as in the other embodiments.

Figure 5:
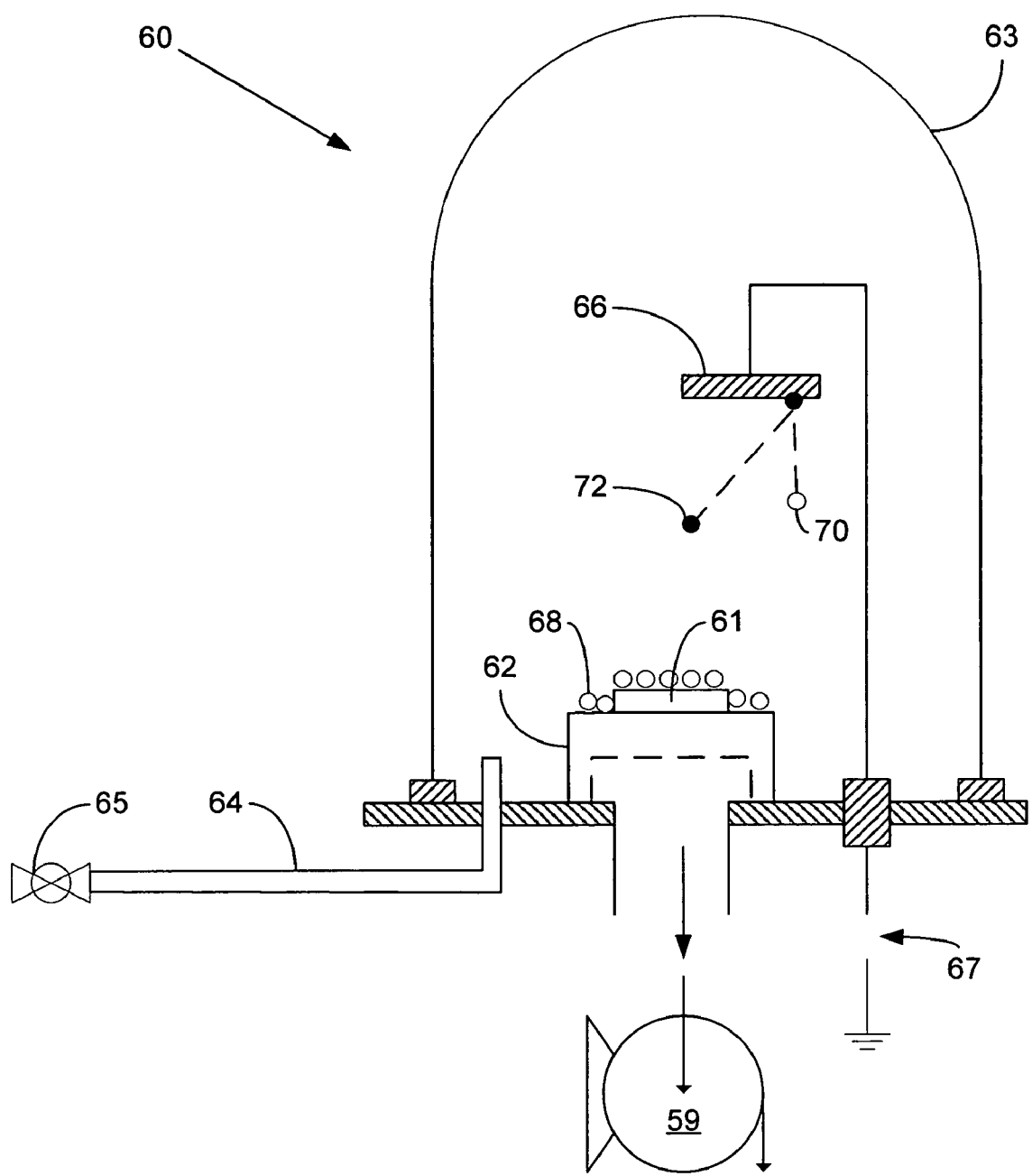
FIG. 5 is a schematic view of a sputtering system used in conjunction with the present invention.

FIG. 5 is a schematic diagram of a sputtering system 60 similar to the one set forth in U.S. Pat. No. 6,586,781. The substrate upon which the sputter layer is intended is indicated at 61 on an electrode (anode) 62 in a chamber 63. The pressure in the chamber 63 is typically reduced using a vacuum pump 59 and the desired gas or gases (typically inert or noble gases such as argon) are added to the chamber 63 through the passage 64 and controlled by the valve 65. When a sufficient voltage is applied between the electrodes (as schematically indicated at 67), gas molecules become ionized and accelerate to impinge upon (in this case) the silicon target 66 which also serves as the cathode. The impinging gas ion will eject silicon ions or atoms 72 which then deposit on the substrate 61 as indicated by the small circles 68.

The nature and operation of sputtering devices is well understood in this art and thus will not be described in further detail. Similarly, appropriate sputtering instruments can be obtained commercially and can be operated by persons of skill in this art without undue experimentation.

Method

In another aspect, the invention is a method of passivating silicon carbide structures and devices and Group III nitride based structures and devices. In this aspect, the invention is a method comprising thermally oxidizing a silicon carbide substrate, annealing the thermal oxide in nitrogen oxide ($N_2O$), sputter-depositing a non-stoichiometric silicon nitride layer on the oxide layer, and depositing an environmental barrier of stoichiometric silicon nitride ($Si_3N_4$) by chemical vapor deposition, and in exemplary cases, by plasma enhanced chemical vapor deposition. Exemplary annealing techniques are set forth in U.S. Pat. No. 6,610,366, in Lipkin, *$N_2O$ Processing Improves the 4H-SiC:$SiO_2$ Interface*; MATERIALS SCIENCE FORUM, Volumes 389-393 (2002) pages 985-88; and in Dmitrijev, *Improving $SiO_2$ Grown on P-type 4H-SiC by NO Annealing*, MATERIALS SCIENCE FORUM, Volumes 264-268 (1998) pages 869-72.

As set forth in the experimental section, in exemplary embodiments the sputtering is carried out using a silicon target in a substantially hydrogen-free environment, which can incorporate argon (Ar) and nitrogen ($N_2$) The method can include sputtering with a pulsed direct current (DC) power source to thereby discharge insulating particles while avoiding arcing.

The sputtering can be carried out at room temperature, or at an elevated substrate temperature. If the sputtering is carried out at an elevated substrate temperature, it should be carried out in a manner that avoids exceeding temperatures that would otherwise detrimentally affect the remainder of the device. The substrate temperature can be raised to between about 350° C. and 450° C. without detrimental effects. The substrate temperature and the gas pressure are typically interrelated and thus are controlled accordingly.

The method can comprise sputtering in a nitrogen-rich environment to provide a nonstoichiometric silicon nitride. The environmental barrier, however, is typically formed of a stoichiometric silicon nitride layer because of its better barrier properties as compared to the nonstoichiometric silicon nitride layer.

The ion bombardment can be enhanced by applying a radio frequency biased to the substrate, or by lowering the ambient pressure during the sputtering step.

The method can be carried out in substantially the same manner for Group III nitride based devices, with the exception that a thermal oxide is not included and the silicon nitride is sputtered directly on the Group III nitride device or structure.

Experimental

SiC Devices

A passivation used on devices consists of first and second passivation. The role of the first passivation is to satisfy surface states and lower interface density. The role of the second passivation is to encapsulate and protect devices from environmental effects. Both passivations may consist of several different dielectric layers.

First Passivation

The first passivation consists of two dielectric layers. A thermal oxide of 100 to 500 Å is grown at 1200° C. The film growth is followed by a 1200° C. $N_2O$ anneal for 1 to 5 hours. The oxidation and the subsequent anneal lowers interface density.

A 1000 to 2000 Å SiN layer can be deposited directly on the thermal oxide, following which ohmic contacts and gates are formed. Alternatively, ohmic contacts can be formed after oxidation, then sputtered SiN can be deposited, and gates formed. In either case, about a 1000 Å passivation layer is deposited prior to T top gates to move the gate metal away from the surface and reduce parasitic capacitance.

As noted above, the sputtered SiN replaces a more traditionally used PECVD SiN film on top of the thermal oxide layer. The sputtered SiN film will contain no hydrogen when a Si target is sputtered in an Ar/$N_2$ environment. A sputtered SiN film can and will eliminate problems associated with hydrogen in the film. It is predicted, although not yet confirmed, that other insulating sputtered nitride films (e.g., aluminum nitride, AlN) can also be used for the same purpose.

The key to reactively sputtering a nitride film in Ar/$N_2$ appears to be the use of pulsed DC power source. The power source reverses bias polarity periodically (80 to 150 kHz, 1000 to 2000 ns) to discharge insulating particles that build up on the target thus avoiding arcs. The SiN passivation can be done at room temperature or at an elevated substrate temperature (350° C.).

The sputtered SiN film in the fist passivation is optimized for minimal device trapping. A SiN film index was found to be an important control parameter for device trapping. A refractive index of 1.85 to 1.95 was found to be optimum. This off-stoichiometry SiN film is deposited in a nitrogen rich environment with minimal bombardment ($N_2$ flow of 14 to 18 sccm and process pressure of 7 to 10 mT). This SiN film, although optimum for device passivation, is not a good encapsulant. That problem is addressed in second passivation.

Second Passivation

The second passivation is added after gates and T top are formed. The second passivation consists of three dielectric layers. The first two dielectric layers are sputtered SiN. The first sputtered SiN layer of 1000 to 3000 Å is a nitrogen rich film ($N_2$ flow of 14 to 18 sccm and process pressure of 7 to 10 mT) with refractive index in the range of 1.85 to 1.95. This film moves the subsequent passivation layers away from the device interface, but does not yet encapsulate. The second sputtered SiN layer with thickness of 1000 to 3000 Å is a stoichiometric nitride with refractive index of 2.04 measured at 630 nm. This film is deposited at lower nitrogen flow and higher bombardment ($N_2$ flow of 12 to 14 sccm and process pressure of 1 to 3 mT). The encapsulating properties of this film are improved by ion bombardment, either through lower pressure, or using RF bias on the wafers (about 0.5 W/inch$^2$). The sputtered SiN film provides good encapsulation, and also moves the third dielectric layer further away from the device interface.

The second sputtered SiN layer, however, may not offer adequate step coverage. This is addressed in the third dielectric layer. A 2000 to 5000 Å PECVD SiN layer is deposited on top of the sputtered SiN layers using $SiH_4$ 2%, 350 sccm; $NH_3$, 4 sccm; $N_2$, 200 sccm; He, 90 sccm; pressure, 1 Torr; power, 25 W. The critical process parameter in the PECVD SiN deposition is substrate temperature; higher substrate temperatures tend to drive hydrogen out of the film. The substrate temperature is kept as high as other existing films on the wafer allow, typically between about 250° C. to 450° C. The stoichiometric sputtered SiN film offers a barrier to the hydrogen present during PECVD deposition. The PECVD offers a final environmental encapsulant with excellent step coverage.

GaN Devices

On GaN devices, the first passivation is deposited after T gates are formed. The first passivation for GaN devices consists of two layers. A sputtered SiN or AlN is deposited on top surface of the GaN (typically AlGaN). This is followed by a PECVD SiN film.

The salient feature is again, to move a typical hydrogen contaminated PECVD nitride film away from the device interface and replace it with a sputtered nitride film (SiN or AlN). This film can also be an oxynitride of Si or Al. A PECVD SiN film is deposited on top of the sputtered passivation layer. The PECVD film offers good step coverage under the gates The second passivation of the GaN devices can use sputtered nitrides or PECVD nitrides or the combination of both.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A passivated semiconductor structure comprising:
   a silicon carbide substrate;
   a thermal oxidation layer on said silicon carbide substrate for lowering the interface density between said silicon carbide substrate and said thermal oxidation layer;
   a first sputtered non-stoichiometric silicon nitride layer on said thermal oxidation layer for reducing parasitic capacitance and minimizing device trapping;
   a second sputtered non-stoichiometric silicon nitride layer on said first sputtered layer for positioning subsequent passivation layers further from said substrate without encapsulating said structure;
   a sputtered stoichiometric silicon nitride layer on said second sputtered layer for encapsulating said structure and for enhancing the hydrogen barrier properties of the passivation layers; and
   a chemical vapor deposited environmental barrier layer of stoichiometric silicon nitride for step coverage and crack prevention on said encapsulant layer.

2. A passivated semiconductor structure according to claim 1 wherein said oxidation layer is a thermal oxidation layer.

3. A passivated semiconductor structure according to claim 1 wherein said thermal oxidation layer is silicon dioxide with a thickness of between about 100 and 500 angstroms.

4. A passivated semiconductor structure according to claim 1 wherein said first silicon nitride layer is substantially hydrogen free.

5. A passivated semiconductor structure according to claim 1 wherein said first silicon nitride layer is between about 1000 and 2000 angstroms thick.

6. A passivated semiconductor structure according to claim 1 wherein said first silicon nitride layer has a refractive index of between about 1.85 and 1.95.

7. A passivated semiconductor structure according to claim 1 wherein said second silicon nitride layer is substantially hydrogen free.

8. A passivated semiconductor structure according to claim 1 wherein said second silicon nitride layer is between about 1000 and 3000 angstroms thick.

9. A passivated semiconductor structure according to claim 1 wherein said second silicon nitride layer has a refractive index of between about 1.85 and 1.95.

10. A passivated semiconductor structure according to claim 1 wherein said stoichiometric encapsulating layer is between about 1000 and 3000 angstroms thick.

11. A passivated semiconductor structure according to claim 1 wherein said encapsulating layer is substantially hydrogen free.

12. A passivated semiconductor structure according to claim 1 wherein said environmental baffler layer is between about 2000 and 5000 angstroms.

13. A passivated semiconductor structure according to claim 1 wherein said environmental barrier layer and said encapsulating layer both comprise $Si_3N_4$.

14. A passivated semiconductor structure according to claim 1 wherein said silicon carbide substrate is a single crystal having a polytype selected from the group consisting of the 3C, 4H, 6H, and 15R polytypes of silicon carbide.

15. A passivated semiconductor structure comprising:
    a Group III nitride layer;
    a first substantially hydrogen free passivation structure on said Group III nitride layer for reducing parasitic capacitance and minimizing device trapping; and
    a second passivation structure on said first passivation structure for encapsulating said structure and providing an environmental barrier;
    said first passivation structure comprising at least one sputtered layer of non-stoichiometric nitride selected from the group consisting of silicon nitride, aluminum nitride, oxynitrides of silicon and oxynitrides of aluminum, and at least one chemical vapor deposited layer of silicon nitride for positioning said passivation layers further from said Group III nitride layer without fully encapsulating said structure; and
    said second passivation structure comprising an environmental baffler of stoichiometric nitrides.

16. A passivated semiconductor structure according to claim 15 further comprising a gate contact to said Group III nitride layer.

17. A passivated semiconductor structure according to claim 16 wherein said Group III nitride layer has a first conductivity type; said structure further comprising:
    respective source and drain regions in said Group III nitride layer and having the opposite conductivity type from said remainder of said Group III nitride layer and defining a channel therebetween; and
    ohmic contacts to said source and drain regions.

18. A passivated semiconductor structure according to claim 15 wherein said Group III nitride layer is selected from the group consisting of gallium nitride and aluminum gallium nitride.

19. A passivated semiconductor structure according to claim 15 wherein said second passivation structure comprises a sputtered stoichiometric layer of silicon nitride and a chemical vapor deposited stoichiometric layer of silicon nitride.

20. A passivated semiconductor structure according to claim 19 wherein said stoichiometric layer in said second passivation structure is substantially hydrogen free.

21. A passivated semiconductor structure according to claim 15 wherein said first passivation structure has a refractive index of between about 1.85 and 1.95.

22. A passivated semiconductor structure according to claim 15 wherein:
    said sputtered layer of non-stoichiometric silicon nitride in said first passivation structure is between about 1000 and 2000 angstroms thick;
    said chemical vapor deposited layer of silicon nitride in said the first passivation structure is between about 1000 and 3000 angstroms thick; and said second passivation structure is between about 3000 and 8000 angstroms thick.

23. An insulated semiconductor device comprising:
a silicon carbide substrate having a first conductivity type;
respective source and drain regions in said substrate having the opposite conductivity type and defining a channel therebetween;
a thermal oxide layer on said substrate between said source and drain for lowering the interface density between said silicon carbide substrate and said thermal oxidation layer;
a gate contact on said thermal oxide layer;
a first passivation structure formed of non-stoichiometric silicon nitride on said thermal oxide layer for reducing parasitic capacitance and minimizing device trapping and positioning subsequent passivation layers further from said substrate; and
a second passivation structure formed of stoichiometric silicon nitride on said first passivation structure for providing an environmental baffler for said device.

24. An insulated semiconductor device according to claim 23 further comprising conductive contacts to said source region and said drain region.

25. An insulated semiconductor device according to claim 23 wherein said first passivation structure comprises two layers of sputtered non-stoichiometric silicon nitride on said thermal oxide layer.

26. An insulated semiconductor device according to claim 23 wherein said second passivation structure comprises a sputter-deposited layer of silicon nitride on said first passivation structure and a chemical vapor deposited layer of silicon nitride on said spotter-deposited layer.

27. An insulated semiconductor device according to claim 26 wherein both of said layers in said second passivation structure comprise $Si_3N_4$.

28. An insulated semiconductor device according to claim 26 wherein said sputter deposited layer in said second passivation structure is substantially hydrogen-free.

29. An insulated semiconductor device according to claim 23 wherein said first passivation structure is substantially hydrogen-free.

30. An insulated semiconductor device according to claim 23 wherein said first passivation structure is between about 2000 and 5000 angstroms thick and has a refractive index of between about 1.85 and 1.95.

31. An insulated semiconductor device according to claim 23 wherein said second passivation structure is between about 3000 and 8000 angstroms thick and has a refractive index of about 2.04.

32. A passivated semiconductor structure comprising:
a silicon carbide substrate;
a thermal oxidation layer on said silicon carbide substrate for lowering the interface density between said silicon carbide substrate and said thermal oxidation layer;
a first substantially hydrogen-free non-stoichiometric silicon nitride layer on said thermal oxidation layer for reducing parasitic capacitance and minimizing device trapping;
a second substantially hydrogen-free non-stoichiometric silicon nitride layer on said first layer for positioning subsequent passivation layers further from said substrate without encapsulating said structure;
a substantially hydrogen-free stoichiometric silicon nitride layer on said second substantially hydrogen-free layer for encapsulating said structure and for enhancing the hydrogen barrier properties of the passivation layers; and
an environmental baffler layer of stoichiometric silicon nitride for step coverage and crack prevention on said encapsulant layer.

33. A passivated semiconductor structure according to claim 32 wherein said first and second substantially hydrogen free stoichiometric silicon nitride layers are sputter-deposited layers.

34. A passivated semiconductor structure according to claim 32 wherein said substantially hydrogen free stoichiometric silicon nitride layer comprises a sputtered layer.

35. A passivated semiconductor structure according to claim 32 wherein said environmental barrier layer of stoichiometric silicon nitride comprises a chemical vapor deposited layer.

36. A passivated structure according to claim 32 wherein said first silicon nitride layer is between about 1000 and 2000 angstroms thick and has a refractive index of between about 1.85 and 1.95.

37. A passivated structure according to claim 32 wherein said second silicon nitride layer is between about 1000 and 3000 angstroms thick and has a refractive index of between about 1.85 and 1.95.

38. A passivated semiconductor structure according to claim 32 wherein said stoichiometric encapsulating layer is between about 1000 and 3000 angstroms thick.

39. A passivated semiconductor structure according to claim 32 wherein said silicon carbide substrate is a single crystal having a polytype selected from the group consisting of the 3C, 4H, 6H, and 15R polytypes of silicon carbide.

* * * * *

UNITED STATES PATENT AND TRADEMARK OFFICE
CERTIFICATE OF CORRECTION

PATENT NO. : 7,525,122 B2 Page 1 of 1
APPLICATION NO. : 11/169378
DATED : April 28, 2009
INVENTOR(S) : Zoltan Ring et al.

It is certified that error appears in the above-identified patent and that said Letters Patent is hereby corrected as shown below:

In the CLAIMS:

Column 10, line 8, delete "baffler" and insert -- barrier --

Column 10, line 34, delete "baffler" and insert -- barrier --

Column 11, line 20, delete "baffler" and insert -- barrier --

Column 12, line 19, delete "baffler" and insert -- barrier --

Signed and Sealed this

Ninth Day of June, 2009

JOHN DOLL
*Acting Director of the United States Patent and Trademark Office*